US011370364B2

(12) United States Patent
Mitchell, Jr. et al.

(10) Patent No.: US 11,370,364 B2
(45) Date of Patent: Jun. 28, 2022

(54) DISPLAY SCREEN MOUNTING ASSEMBLY

(71) Applicant: Ford Global Technologies, LLC, Dearborn, MI (US)

(72) Inventors: Daniel D. Mitchell, Jr., Southgate, MI (US); Victor A. Johnson, Royal Oak, MI (US); Tim R. Beard, St. Clair Shores, MI (US); Dan G. Busuioc, Dearborn, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 234 days.

(21) Appl. No.: 16/275,693

(22) Filed: Feb. 14, 2019

(65) Prior Publication Data

US 2020/0262356 A1  Aug. 20, 2020

(51) Int. Cl.
| | |
|---|---|
| B60R 11/02 | (2006.01) |
| H05K 5/00 | (2006.01) |
| H05K 5/02 | (2006.01) |
| B60R 11/00 | (2006.01) |

(52) U.S. Cl.
CPC ........ *B60R 11/0235* (2013.01); *H05K 5/0017* (2013.01); *H05K 5/0204* (2013.01); *H05K 5/0247* (2013.01); *B60R 2011/0005* (2013.01)

(58) Field of Classification Search
CPC ......... B60R 11/0235; B60R 2011/0005; B60R 11/0229; H05K 5/0017; H05K 5/0204; Y10T 16/537; A47B 96/07
USPC .... 248/919, 920, 921, 922, 923, 131, 282.1, 248/289.11, 126, 122.1, 133, 138, 185.1, 248/186.2; 296/193.02, 24.3, 24.39, 70, 296/72, 73
See application file for complete search history.

(56) References Cited

U.S. PATENT DOCUMENTS

| | | | | |
|---|---|---|---|---|
| 4,639,147 | A * | 1/1987 | Schwarz ................ | A47K 13/12 114/144 R |
| 5,326,133 | A | 7/1994 | Breed et al. | |
| 5,813,649 | A | 9/1998 | Peterson et al. | |
| 7,028,961 | B1 * | 4/2006 | Dittmer .................. | F16M 11/04 248/278.1 |
| 7,380,760 | B2 * | 6/2008 | Dittmer ................ | F16M 11/041 248/278.1 |
| 7,487,943 | B1 * | 2/2009 | Gillespie ................ | F16M 11/10 248/279.1 |
| 7,744,384 | B2 * | 6/2010 | Wu ...................... | H05K 1/0215 439/95 |
| 8,693,172 | B2 * | 4/2014 | Russell .............. | F16M 11/2014 361/679.01 |

(Continued)

FOREIGN PATENT DOCUMENTS

| | | | |
|---|---|---|---|
| CN | 201472259 U | | 5/2010 |
| CN | 204127589 U | * | 1/2015 |

(Continued)

*Primary Examiner* — Kimberly T Wood
(74) *Attorney, Agent, or Firm* — Vichit Chea; Price Heneveld LLP (57) ABSTRACT

A vehicle display screen mounting assembly includes an instrument panel and a display screen coupled to a casing. The casing includes a protrusion extending from a back surface of the casing towards the instrument panel. A bushing is positioned within a receiving channel defined by the protrusion. An attachment feature is coupled to the protrusion of the casing and is coupled to the instrumental panel via a bracket.

15 Claims, 7 Drawing Sheets

(56) References Cited

U.S. PATENT DOCUMENTS

| | | | | |
|---|---|---|---|---|
| 10,067,342 B2* | 9/2018 | Klabukov | ............ | G02B 27/0101 |
| 10,099,556 B2* | 10/2018 | Connolly | ............... | B60K 37/02 |
| 10,595,634 B2* | 3/2020 | Pei | ..................... | F16M 11/2092 |
| 2002/0003571 A1* | 1/2002 | Schofield | ............ | B60R 11/0235 |
| | | | | 348/148 |
| 2003/0146640 A1* | 8/2003 | Nakajima | .............. | B60K 37/02 |
| | | | | 296/70 |
| 2004/0021051 A1* | 2/2004 | Chiu | ..................... | F16M 11/24 |
| | | | | 248/371 |
| 2004/0118987 A1* | 6/2004 | Matko | ................. | B60R 11/0235 |
| | | | | 248/282.1 |
| 2004/0124317 A1* | 7/2004 | Wallaker | ............... | B60R 11/02 |
| | | | | 248/27.1 |
| 2005/0035252 A1* | 2/2005 | Chen | ................... | B60R 11/0235 |
| | | | | 248/284.1 |
| 2005/0127253 A1* | 6/2005 | Kim | ....................... | F16M 13/02 |
| | | | | 248/176.1 |
| 2006/0022102 A1* | 2/2006 | Dittmer | ................... | F16M 13/02 |
| | | | | 248/276.1 |
| 2006/0175515 A1* | 8/2006 | Frydkjaer | .............. | F16M 13/02 |
| | | | | 248/372.1 |
| 2006/0249632 A1* | 11/2006 | McKelvey | .............. | B60R 11/02 |
| | | | | 224/539 |
| 2008/0029669 A1 | 2/2008 | Olah et al. | | |
| 2008/0232051 A1* | 9/2008 | Zhou | ...................... | F16M 11/10 |
| | | | | 361/679.05 |
| 2010/0172072 A1* | 7/2010 | Monaco | ................. | F16M 11/38 |
| | | | | 361/679.01 |
| 2011/0138574 A1* | 6/2011 | Bogue | .................... | B64D 29/06 |
| | | | | 16/221 |
| 2012/0279014 A1* | 11/2012 | Carlsson | ................. | F16C 23/10 |
| | | | | 16/273 |
| 2013/0056601 A1* | 3/2013 | Stemple | ............. | F16M 11/2092 |
| | | | | 248/282.1 |
| 2013/0104341 A1* | 5/2013 | Kenerly | .................... | E05D 3/02 |
| | | | | 16/273 |
| 2015/0131214 A1* | 5/2015 | Liu | ......................... | F16M 11/22 |
| | | | | 361/679.01 |
| 2016/0200263 A1* | 7/2016 | An | ......................... | B60K 37/04 |
| | | | | 296/70 |
| 2017/0282812 A1* | 10/2017 | Yoshimura | ............ | H05K 5/0204 |
| 2018/0216777 A1* | 8/2018 | Speicher | ............. | F16M 11/2021 |
| 2019/0135192 A1* | 5/2019 | Adamson, Sr. | ..... | B60R 11/0229 |
| 2019/0176626 A1* | 6/2019 | Akaike | .................. | B60N 3/001 |
| 2019/0375342 A1* | 12/2019 | Mullen | ............... | B60R 11/0235 |
| 2020/0120305 A1* | 4/2020 | Pei | ....................... | A47B 97/001 |
| 2020/0262357 A1* | 8/2020 | Kuchibhatla | ........ | H05K 5/0017 |
| 2020/0391669 A1* | 12/2020 | Fontaeus | ............ | B60K 35/00 |
| 2020/0406831 A1* | 12/2020 | Michel | ............... | B60R 11/0235 |

FOREIGN PATENT DOCUMENTS

| | | | | | |
|---|---|---|---|---|---|
| FR | | 2829979 A1 | * | 3/2003 | ......... B60R 11/0235 |
| GB | | 2047327 A | * | 11/1980 | ............... E05D 5/16 |
| JP | | H04116260 U | * | 10/1992 | ............... E05D 5/14 |
| JP | | 2006282100 A | | 4/2005 | |
| JP | | 2005161888 A | * | 6/2005 | |
| JP | | 4001273 B2 | * | 10/2007 | |

* cited by examiner

FIG. 8

DISPLAY SCREEN MOUNTING ASSEMBLY

FIELD OF THE DISCLOSURE

The present disclosure generally relates to a display screen mounting assembly, and, more specifically, to a vehicle display screen mounting assembly.

BACKGROUND OF THE DISCLOSURE

Vehicle displays often require a vehicle-specific bracket to attach the display to the vehicle. The vehicle-specific brackets typically are designed to only absorb energy in a single direction.

SUMMARY OF THE DISCLOSURE

According to at least one aspect of the present disclosure, a vehicle display screen mounting assembly includes an instrument panel and a display screen coupled to a casing. The casing includes a protrusion extending from a back surface of the casing towards the instrument panel. A bushing is positioned within a receiving channel defined by the protrusion. An attachment feature is coupled to the protrusion of the casing and is coupled to the instrument panel via a bracket.

According to another aspect of the present disclosure, a display screen mounting assembly for a vehicle includes a display screen coupled to a casing. The casing includes first and second protrusions defining first and second receiving channels, respectively. First and second bushings are positioned within the first and second receiving channels. An attachment feature is coupled to the first and second protrusions and includes first and second tabs. A bracket is coupled to the attachment feature.

According to another aspect of the present disclosure, a display screen mounting assembly for a vehicle including a display screen coupled to a casing. A bushing is positioned within a protrusion of the casing. An attachment feature is coupled to the protrusion and includes a conductive connection between the casing and a bracket coupled to the attachment feature.

These and other aspects, objects, and features of the present disclosure will be understood and appreciated by those skilled in the art upon studying the following specification, claims, and appended drawings.

BRIEF DESCRIPTION OF THE DRAWINGS

The following is a description of the figures in the accompanying drawings. The figures are not necessarily to scale, and certain features and certain views of the figures may be shown exaggerated in scale or in schematic in the interest of clarity and conciseness.

In the drawings.

DETAILED DESCRIPTION OF THE PREFERRED EMBODIMENTS

Additional features and advantages of the invention will be set forth in the detailed description which follows and will be apparent to those skilled in the art from the description, or recognized by practicing the invention as described in the following description, together with the claims and appended drawings.

Figure 1:
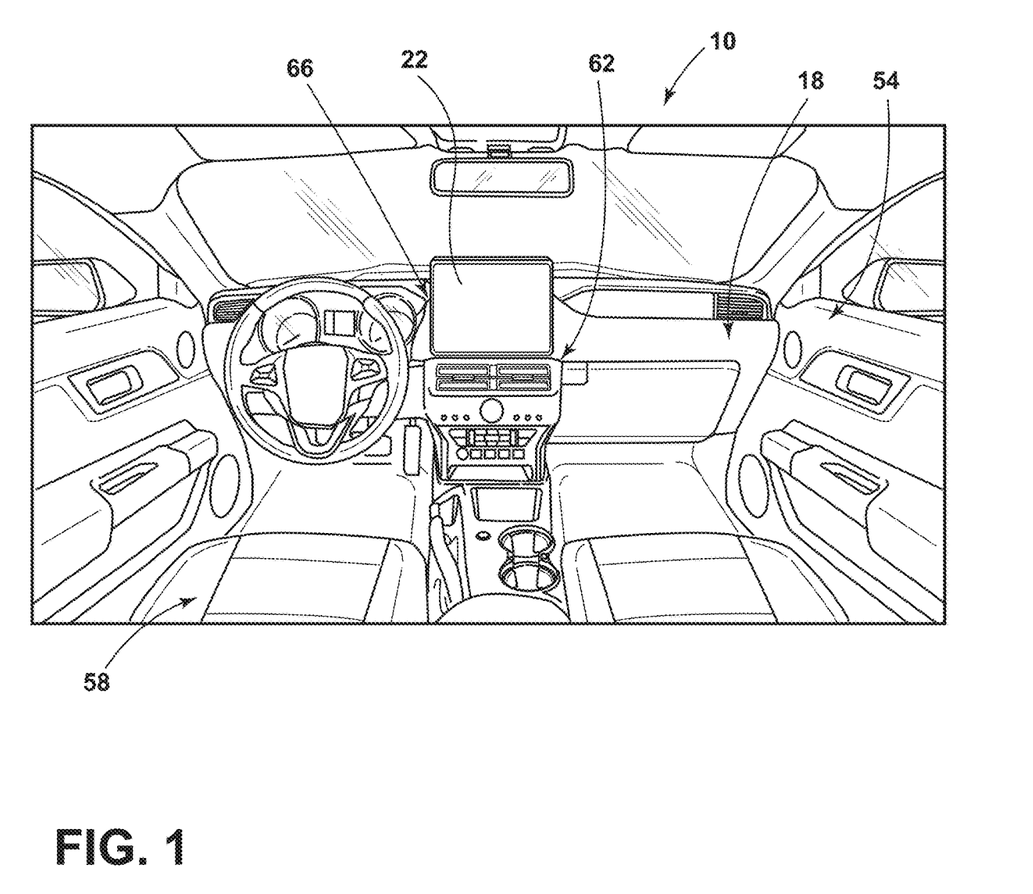
FIG. 1 is a rear perspective view of a passenger area within a vehicle, according to one example.

For purposes of description herein, the terms "upper," "lower," "right," "left," "rear," "front," "vertical," "horizontal," and derivatives thereof shall relate to the concepts as oriented in FIG. 1. However, it is to be understood that the concepts may assume various alternative orientations, except where expressly specified to the contrary. It is also to be understood that the specific devices and processes illustrated in the attached drawings, and described in the following specification are simply exemplary embodiments of the inventive concepts defined in the appended claims. Hence, specific dimensions and other physical characteristics relating to the embodiments disclosed herein are not to be considered as limiting, unless the claims expressly state otherwise.

As used herein, the term "and/or," when used in a list of two or more items, means that any one of the listed items can be employed by itself, or any combination of two or more of the listed items, can be employed. For example, if a composition is described as containing components A, B, and/or C, the composition can contain A alone; B alone; C alone; A and B in combination; A and C in combination; B and C in combination; or A, B, and C in combination.

As used herein, the terms "about" and "approximately" mean that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. When the term "about" or "approximately" is used in describing a value or an end-point of a range, the disclosure should be understood to include the specific value or end-point referred to. Whether or not a numerical value or end-point of a range in the specification recites "about" or "approximately," the numerical value or end-point of a range is intended to include two embodiments: one modified by "about," and one not modified by "about." It will be further understood that the end-points of each of the ranges are significant both in relation to the other end-point, and independently of the other end-point.

The terms "substantial," "substantially," and variations thereof as used herein are intended to note that a described feature is equal or approximately equal to a value or description. For example, a "substantially planar" surface is intended to denote a surface that is planar or approximately planar. Moreover, "substantially" is intended to denote that two values are equal or approximately equal. In some embodiments, "substantially" may denote values within about 10% of each other, such as within about 5% of each other, or within about 2% of each other.

As used herein the terms "the," "a," or "an," mean "at least one," and should not be limited to "only one" unless explicitly indicated to the contrary. Thus, for example, reference to "a component" includes embodiments having two or more such components unless the context clearly indicates otherwise.

In this document, relational terms, such as first and second, top and bottom, and the like, are used solely to distinguish one entity or action from another entity or action, without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

With reference to FIG. 1-8, reference numeral 10 generally designates a vehicle having a display screen mounting assembly 14 including an instrument panel 18. A display screen 22 is coupled to a casing 26. The casing 26 includes a protrusion 30 extending from a back surface 34 of the casing 26 towards the instrument panel 18. A bushing 38 is positioned within a receiving channel defined by the protrusion 30. An attachment feature 46 is coupled to the protrusion 30 of the casing 26 and is coupled to the instrument panel 18 via a bracket 50.

Referring to FIG. 1, the vehicle 10 includes a passenger area 54 having a seating row 58. The instrument panel 18 is positioned in a vehicle-forward direction of the seating row 58. As illustrated, the instrument panel 18 includes a control panel 62 for operating various systems within the vehicle 10. The instrument panel 18 also includes the display screen 22 positioned in a central portion 66 of the instrument panel 18. As illustrated, the display screen 22 is a free-standing display screen cantilevered to the instrument panel 18. However, it is contemplated that other types of display screens 22 may be utilized without deviating from the teaching herein. Referring still to FIG. 1, the display screen 22 may extend upwards from and/or out of the instrument panel 18 to create the free-standing effect.

Figure 2:
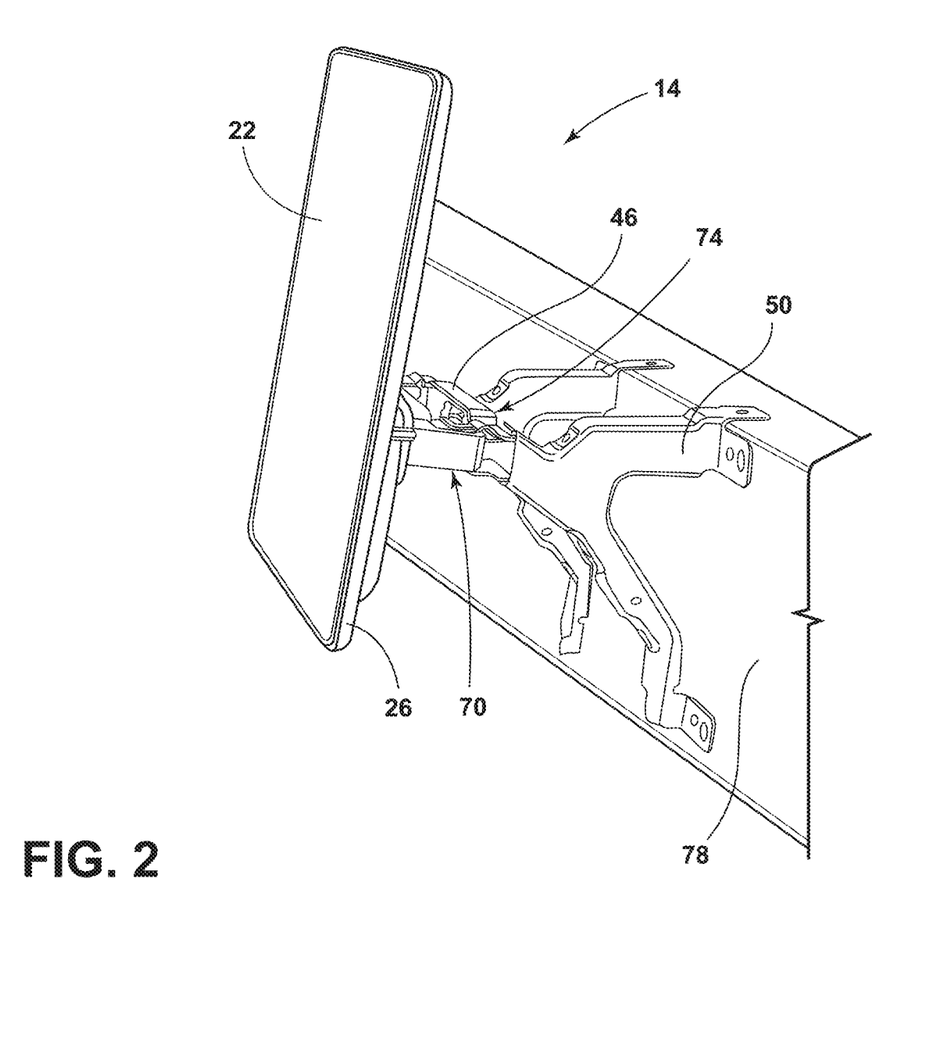
FIG. 2 is a side perspective view of a vehicle display mounting assembly, according to one example.

Referring to FIG. 2, the display screen mounting assembly 14 is shown in an assembled state. The mounting assembly 14 may be, for example, a vehicle display screen mounting assembly or a display screen mounting assembly for the vehicle 10. The mounting assembly 14 includes the casing 26 coupled to the display screen 22. The casing 26 may be coupled to a vehicle-rearward side 70 of the attachment feature 46. A vehicle-forward side 74 of the attachment feature 46 may be coupled to the bracket 50, and the bracket 50 may further be coupled to a support structure 78 within the instrument panel 18. The mounting assembly 14 may be configured such that the attachment feature 46 and bracket 50 may be hidden from the view of an occupant within the vehicle 10. Accordingly, the casing 26 and the display screen 22 may be the components of the mounting assembly 14 visible to occupants seated within the vehicle 10.

Figure 3:
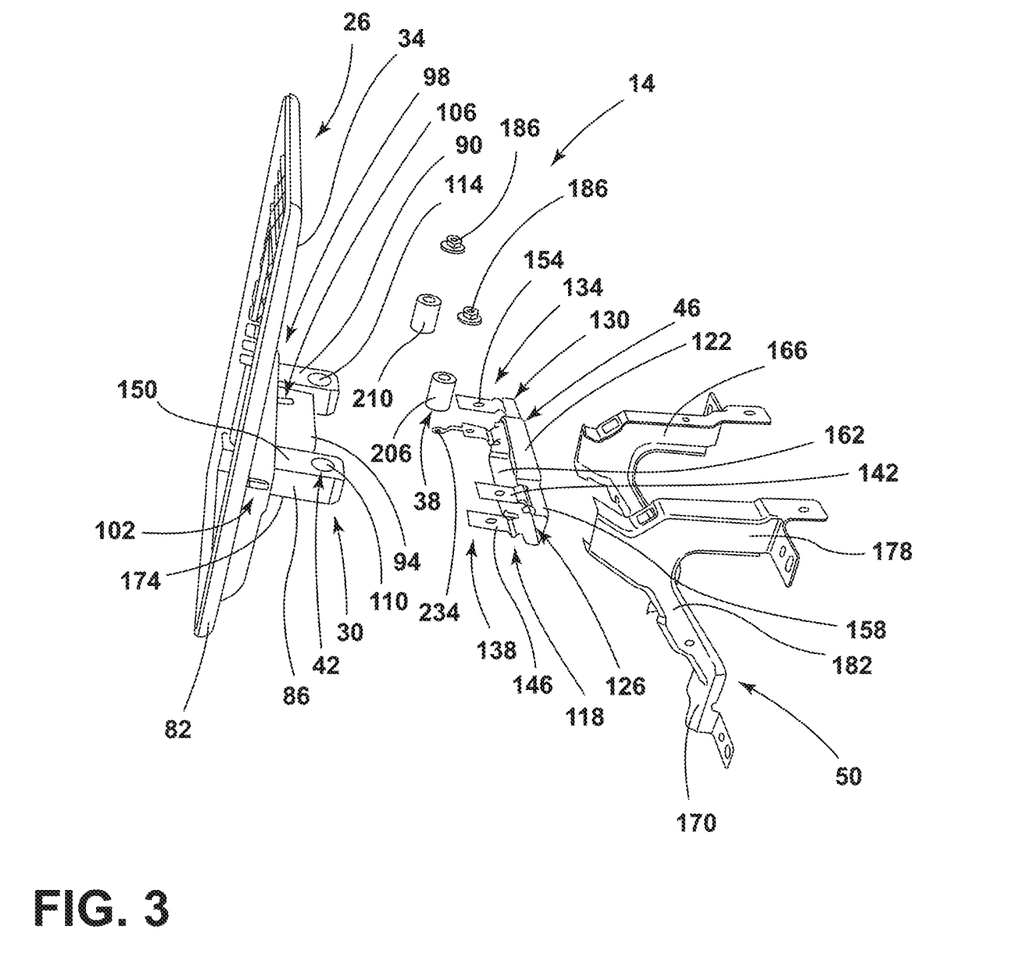
FIG. 3 is an exploded side perspective view of the vehicle display mounting assembly, according to one example.

Referring now to FIG. 3, the casing 26 of the mounting assembly 14 includes a holder 82 for housing the display screen 22 (FIG. 2) and a protrusion 30 extending from a back surface 34 of the holder 82 of the casing 26 in a vehicle-forward direction towards the instrument panel 18. As illustrated, the casing 26 includes a first protrusion 86 and a second protrusion 90. The first and second protrusions 86, 90 may extend from left and right side portions 98, 102 of the back surface 34 of the casing 26, respectively. The first and second protrusions 86, 90 may be aligned horizontally. The first and second protrusions 86, 90 may each define the receiving channels. In other words, the first and second protrusions 86, 90 define first and second receiving channels 110, 114, respectively.

When assembled, the attachment feature 46 is coupled to the protrusion 30 of the casing 26. In the depicted example, the attachment feature 46 couples to the first and second protrusions 86, 90 of the casing 26. The attachment feature 46 includes a tab 118 extending from a body 122 of the attachment feature 46 towards the casing 26. In various examples, the attachment feature 46 may include a first tab 126 and a second tab 130. As illustrated, the first and second tabs 126, 130 extend from left and right end portions 134, 138 of the body 122 of the attachment feature 46. The first and second tabs 126, 130 cooperate with the protrusion 30 of the casing 26 for coupling the attachment feature 46 to the casing 26. Additionally, the attachment feature 46 may be formed from, for example, metals, metal alloys, or composites.

In various examples, the attachment feature 46 may include multiple tabs 118 extending from the body 122 of the attachment feature 46. Additionally, or alternatively, the first and second tabs 126, 130 may each include an upper tab portion 142 and a lower tab portion 146. In other words, as illustrated in FIG. 3, the first tab 126 includes a first upper tab portion and a first lower tab portion, and the second tab 130 includes a second upper tab portion and a second lower tab portion. The upper tab portions 142 may be configured to abut top surfaces 150 of each of the first and second protrusions 86, 90 of the casing 26, respectively. Similarly, the lower tab portions 146 may be configured to abut bottom surfaces 174 of the first and second protrusions 86, 90, respectively. The upper and lower tab portions 142, 146 of the first tab 126 each define an aperture 154, which are configured to vertically align with the first receiving channel 110 of the first protrusion 86 of the casing 26 when the mounting assembly 14 is assembled. Similarly, the upper and lower tab portions 142, 146 of the second tab 130 may each define the apertures 154, which are configured to vertically align with the second receiving channel 114 of the second protrusion 90 of the casing 26.

Referring still to FIG. 3, as illustrated, the upper tab portions 142 extend from an upper surface 158 of the body 122 of the attachment feature 46, and the lower tab portions 146 extend from a lower surface 162 of the body 122 of the attachment feature 46. Additionally, the first tab 126 extends from the left end portion 134 of the body 122, and the second tab 130 extends from the right end portion 138 of the body 122. Accordingly, the first tab 126 extends from an opposing end portion of the attachment feature 46 relative to the second tab 130. The upper tab portions 142, may be vertically aligned with the lower tab portions 146. Additionally, or alternatively, the upper tab portions 142 may be offset from the lower tab portions 146. Each of the upper and lower tab portions 142, 146 may extend substantially the same distance from the body 122 of the attachment feature 46.

The attachment feature 46 is configured to couple to the bracket 50. As illustrated, the bracket 50 includes a left portion 166 and a right portion 170. Each of the left and right portions 166, 170 of the bracket 50 may have a horizontal support 178 coupled to an oblique support 182. The horizontal and oblique supports 178, 182 may each couple to the support structure 78 (FIG. 2) of the instrument panel 18 at an opposing end relative to where the horizontal and oblique supports 178, 182 are coupled together. Accordingly, the attachment feature 46 may be coupled to the instrument panel 18 (FIG. 1) via the bracket 50. The bracket 50 may be vehicle-specific and, therefore, may differ in shape, size, and/or material based on the model and/or size of the vehicle 10. The bracket 50 may be formed from, for example, metals, metal alloys, or composites. As illustrated, the horizontal and oblique supports 178, 182 are coupled to the instrument panel 18 (FIG. 1) and extend in a vehicle-rearward direction. As such, the bracket 50 may form, at least partially, a cantilever support for the casing 26 and/or the display screen (FIG. 1).

Referring now to FIGS. 3-5A, the apertures 154 defined by the upper and lower tabs 142, 146 of the first tab 126, and the apertures 154 defined by the upper and lower tab portions 142, 146 of the second tab 130 may be vertically aligned, respectively. When assembled, the apertures 154 may be positioned proximate the first and second receiving channels 110, 114. In other words, the apertures 154 of the upper tab portions 142 may be positioned over the first and second receiving channels 110, 114 and the apertures 154 of the lower tab portions 146 may be positioned below the first and second receiving channels 110, 114, respectively. As such, the apertures 154 may form a continuous channel for receiving a fastener 186 with each of the first and second receiving channels 110, 114.

Figure 4:
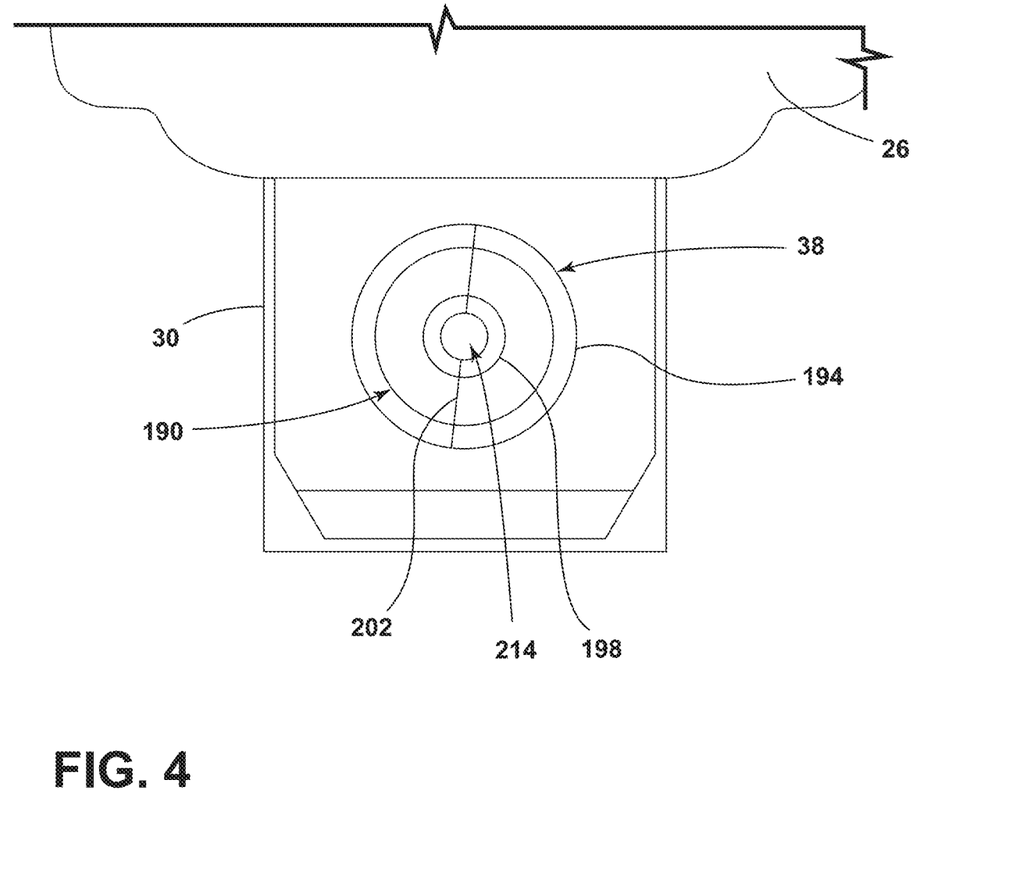
FIG. 4 is a top view of a bushing within a casing of the vehicle display mounting assembly, according to one example.
Figure 5A:
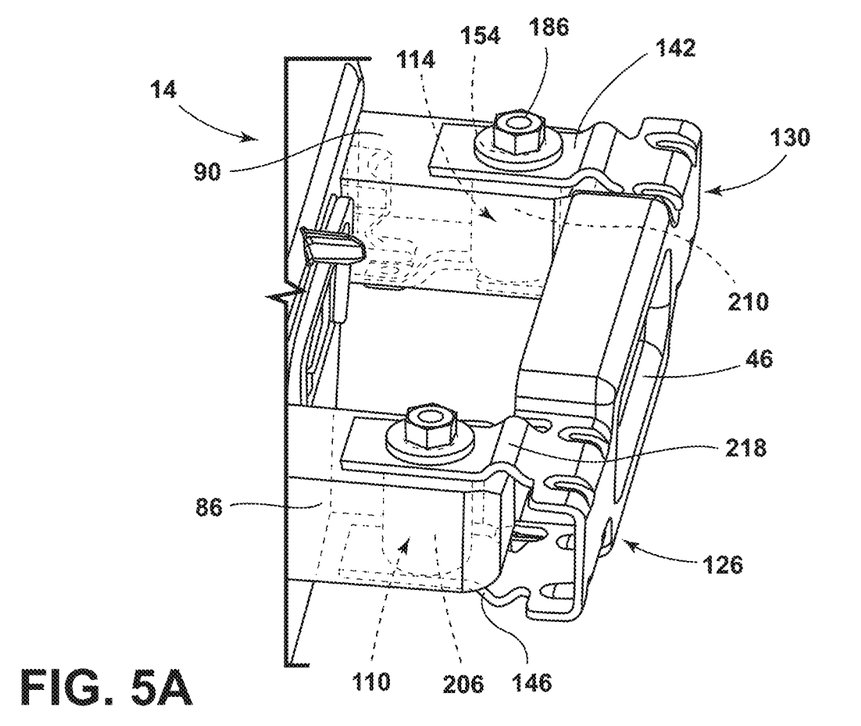
FIG. 5A is a side perspective view of an attachment feature of the vehicle display mounting assembly, according to one example.

Referring to FIGS. 4 and 5A, as illustrated, the bushing 38 is positioned within the receiving channel defined by the protrusion 30 of the casing 26. The bushing 38 may be formed from, for example, rubber or urethane to provide for variable Shore hardness of the bushing 38. The bushing 38 may additionally have elastomer properties. The bushing 38 may have a Shore hardness value in a range of from approximately 20 Shore A to approximately 100 Shore A. Additionally, or alternatively, the bushing 38 may have a Shore hardness value in a range of from approximately 30 Shore D to approximately 75 Shore D. Further, the bushing 38 may be formed from multi-hardness and/or dual durometer materials. In such examples, properties of the bushing 38 may differ across the bushing 38. For example, a portion of the bushing 38 may be flexible or resilient (e.g., an interior 190) to provide dampening effects while another portion of the bushing 38 (e.g., an outer layer 194) may be rigid allowing for impact resistance. As such, the outer layer 194 can provide resilient properties and the interior 190 can provide shock-absorbing properties to the bushing 38. Additionally, the more rigid outer layer 194 may provide a desired shape of the bushing 38 while allowing the less rigid interior 190 to twist and/or move in response to motion of the vehicle 10. It is also contemplated that the material utilized for forming the outer layer 194 may be variable for casting compatibility. The materials and/or stiffness of the bushing 38 may be adaptable to a size of the display screen 22, a size of the vehicle 10, and/or forces acting on the mounting assembly 14. The bushing 38 may also include an indexing feature 198 for adjusting and/or orienting the bushing 38 within the receiving channel. In various examples, the indexing feature 198 may be integrated into the bushing 38. Additionally, the bushing 38 may be tunable via internal plates 202, which can directionally guide force acting on the bushing 38 and/or the mounting assembly 14.

As illustrated, the mounting assembly 14 includes first and second bushings 206, 210 positioned within the first and second receiving channels 110, 114, respectively. The first and second bushings 206, 210 may be vertically-oriented within the first and second receiving channels 110, 114, respectively, such that the first and second bushings 206, 210 are configured to interact with omni-directional and rotational forces acting on the mounting assembly 14. In other words, the first and second bushings 206, 210 may be configured to provide 360° energy absorption. The vertical orientation of the first and second bushings 206, 210 may allow for offsetting a bushing sleeve or tapering for enhanced tuning capabilities. In various examples, the first and second bushings 206, 210 each define an inner cavity 214. When positioned in the first receiving channel 110 of the first protrusion 86, the inner cavity 214 of the first bushing 206 may vertically align with the apertures 154 of the upper and lower tab portions 142, 146 of the first tab 126. Similarly, when the second bushing 210 is positioned within the second receiving channel 114 of the second protrusion 90, the inner cavity 214 of the second bushing 210 may vertically align with the apertures 154 of the upper and lower tab portions 142, 146 of the second tab 130 of the attachment feature 46.

Referring further to FIGS. 4 and 5A, the attachment feature 46 is coupled and/or retained to the casing 26 via the fasteners 186. The fasteners 186 extend through the apertures 154 defined by the attachment feature 46 and the inner cavities 214 of the first and second bushings 206, 210, respectively. In various examples, the fasteners 186 may extend through the apertures 154 of the first and second tabs 126, 130 and further extend through the inner cavities 214 of the first and second bushings 206, 210. The fasteners 186 may be, for example, screws, bolts, pins, or other fastening members.

Figure 5B:
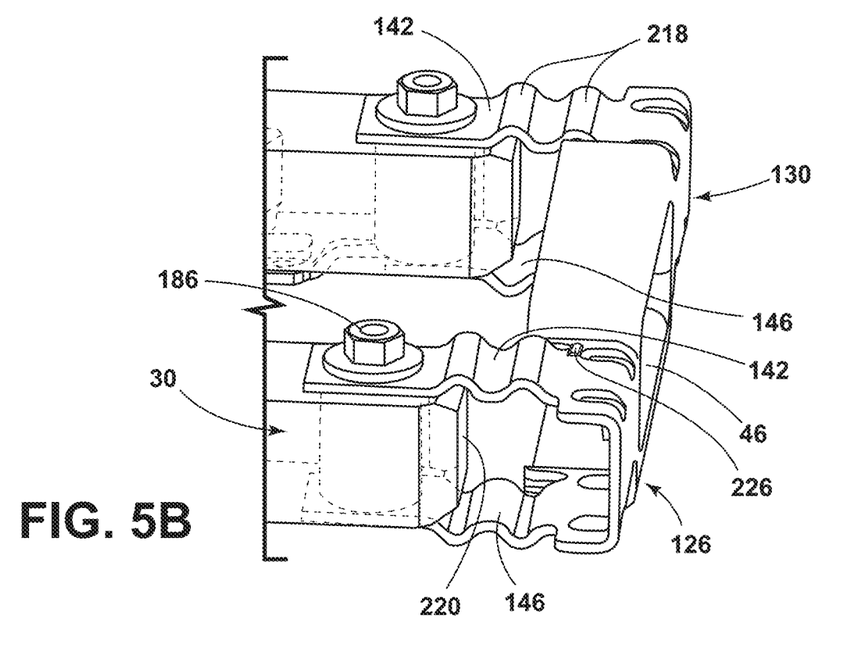
FIG. 5B is a side perspective view of the attachment feature, according to one example.

Referring to FIGS. 5A and 5B, the first and second tabs 126, 130 each define a rib 218 for controlling displacement of at least one of the attachment feature 46, the display screen, and the casing 26. As illustrated, the upper tab portions 142 and the lower tab portions 146 of the first and second tabs 126, 130 each include at least one rib 218. It is contemplated that the upper and lower tab portions 142, 146 of the first and second tabs 126, 130 may not each define the rib 218. In other words, at least one of the upper and/or lower tab portions 142, 146 of the first and/or second tabs 126, 130 may not include the rib 218. In various examples, the ribs 218 are integrally defined by the first and second tabs 126, 130. The ribs 218 of the upper tab portions 142 extend upwards from the first and second tabs 126, 130, respectively, and the ribs 218 of the lower tab portions 146 extend downwards from the first and second tabs 126, 130, respectively. However, it is contemplated that any of the ribs 218 may extend upwards or downwards. The ribs 218 of the upper tab portions 142 may be in vertical alignment with the ribs 218 of the lower tab portions 146. Additionally, or alternatively, the ribs 218 of the upper tab portions 142 may be offset from the ribs 218 of the lower tab portions 146.

The ribs 218 may be advantageous for absorbing energy and/or controlling directional displacement after maximum bushing displacement. Each rib 218, and therefore each of the first and second tabs 126, 130, may be configured to deform at different rates in response to a force (e.g., an impact force) acting on the attachment feature 46 and/or the mounting assembly 14. Having each of the first and second tabs 126, 130 and/or ribs 218 yield at different rates may be advantageous to allow load displacement and/or absorption of energy, such that the mounting assembly 14 can react in an omni-directional and/or non-uniform manner. The force acting on the mounting assembly 14 may be from, for example, impact on the vehicle 10 or force by the occupant on the display screen 22 (FIG. 1) (e.g., push/pull forces or normal interactions). The ribs 218 may extend across a width of the first and second tabs 126, 130. As illustrated in FIG. 5B, the upper tab portions 142 and the lower tab portions 146 may each include more than one rib 218. In such examples, the first and second tabs 126, 130 may have a greater length than when the first and second tabs 126, 130 each including a single rib 218. As such, the body 122 of attachment feature 46 may be positioned adjacent a vehicle-forward surface 220 of the first and second protrusions 86, 90, or may be spaced apart from the vehicle-forward surface 220, as shown in FIG. 5B. The ribs 218 may be positioned parallel to adjacent ribs 218 of the same tab (e.g., the first or second tab 126, 130, respectively). Additionally, an angle formed by sides of the ribs 218 may be adjusted for desired load displacement. For example, the angle formed by an interior surface 222 of the sides of each rib 218 may be adjusted to provide for angular adjustability for load displacement. Further, enhanced adjustability may be achieved by, for example, adjusting material thickness and/or material selection of the ribs 218 and/or attachment feature 46.

Referring still to FIGS. 5A and 5B, the fasteners 186 are positioned proximate to the ribs 218 on each of the first and second tabs 126, 130. In various examples, the fasteners 186 may be adjacent to the ribs 218. Having the fastener 186 positioned proximate to the ribs 218 can assist in directing energy and/or a load operating on the protrusion 30 into the ribs 218, which can allow for absorbing and/or dampening an impact situation. For example, the fasteners 186 may direct a column load into the ribs 218. Additionally, or alternatively, the attachment feature 46 may also include a stiffening bead 226 for increasing the stiffness of the attachment feature 46. The stiffening bead 226, as illustrated, is defined by the upper surface 158 of the body 122 of the attachment feature 46 proximate the first and/or second tabs 126, 130. In various examples, the attachment feature 46 can include multiple stiffening beads 226 positioned proximate to the upper tab portions 142 and/or the lower tab portions 146 of the first and/or second tabs 126, 130. The stiffening beads 226 may operate to direct an opposing column load into the ribs 218. The stiffening beads 226 may operate in conjunction with the position of the fasteners 186 to direct a column load and on opposing column load into the ribs 218.

Figure 6:
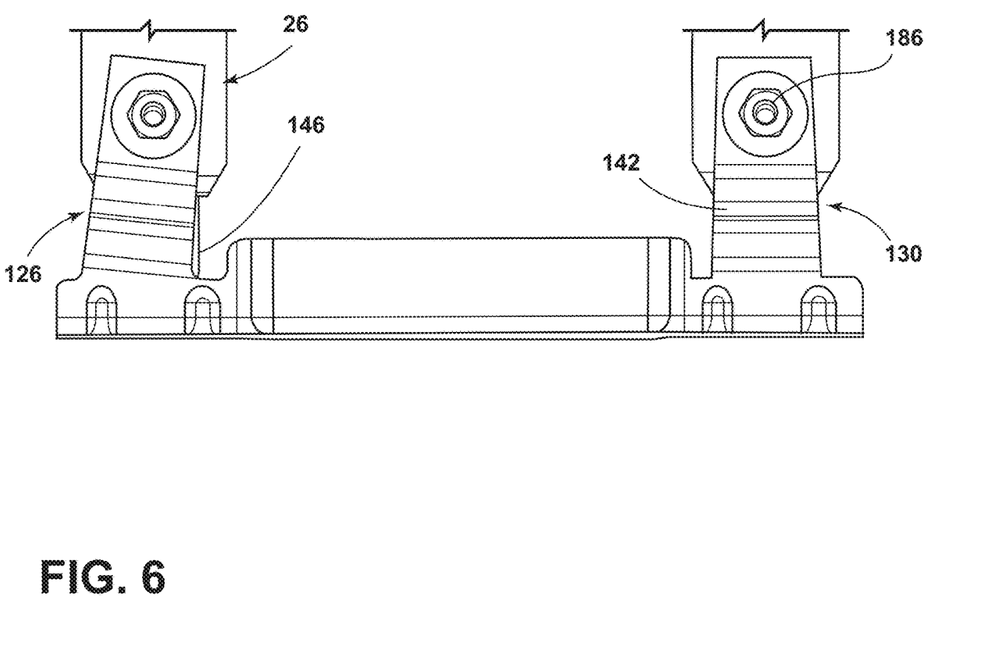
FIG. 6 is a top view of the attachment feature, according to one example.

Referring now to FIG. 6, the first and second tabs 126, 130 extend towards the casing 26 at an angle in a range of from approximately 45° to approximately 90° relative to the body 122 of the attachment feature 46. As illustrated, the first and second tabs 126, 130 are independently variable in angularity. In other words, the upper tab portions 142 and lower tab portions 146 the first and second tabs 126, 130 may each extend towards the casing 26 at a different angle. It is also contemplated that the upper tab portions 142 may extend at a substantially similar angle, the lower tab portions 146 may extend at a substantially similar angle, or a combination thereof. The independently variability of the first and second tabs 126, 130 can provide for rotational load displacement within the mounting assembly 14.

Figure 7:
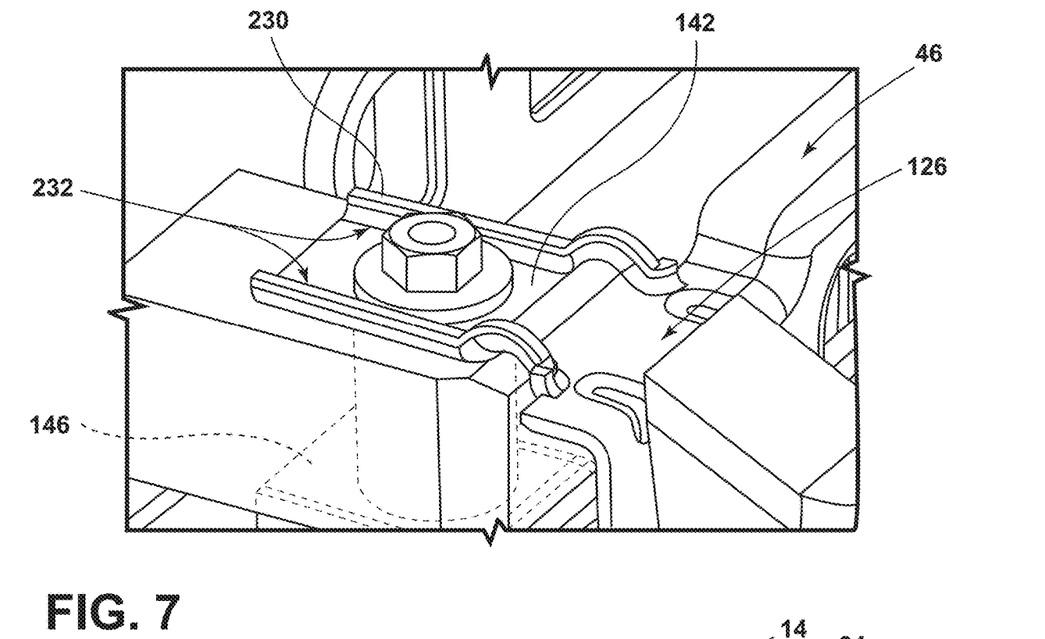
FIG. 7 is a partial side perspective view of the attachment feature, according to one example.

Referring to FIG. 7, the first tab 126 is illustrated including a flange 230 extending from lateral edges 232 of the first tab 126. The flange 230 may be, for example, a standing flange extending vertically upwards from the upper tab portion 142 of the first tab 126. It is contemplated that the lower tab portion 146 of the first tab 126 may additionally or alternatively include the flange 230 extending vertically downwards from the first tab 126. The flange 230 is illustrated as extending at an angle of approximately 90° relative to the first tab 126. However, the flange 230 may extend at an angle in a range of from approximately 30° to approximately 90°. It is also contemplated that the second tab 130 (FIG. 2) may include the flange 230 oriented and/or positioned in a similar manner as the flange 230 on the first tab 126. The flange 230 may be advantageous to increase the stiffness and/or rigidity of the first and second tabs 126, 130 if the load acting on the attachment feature 46 starts peaking.

Figure 8:
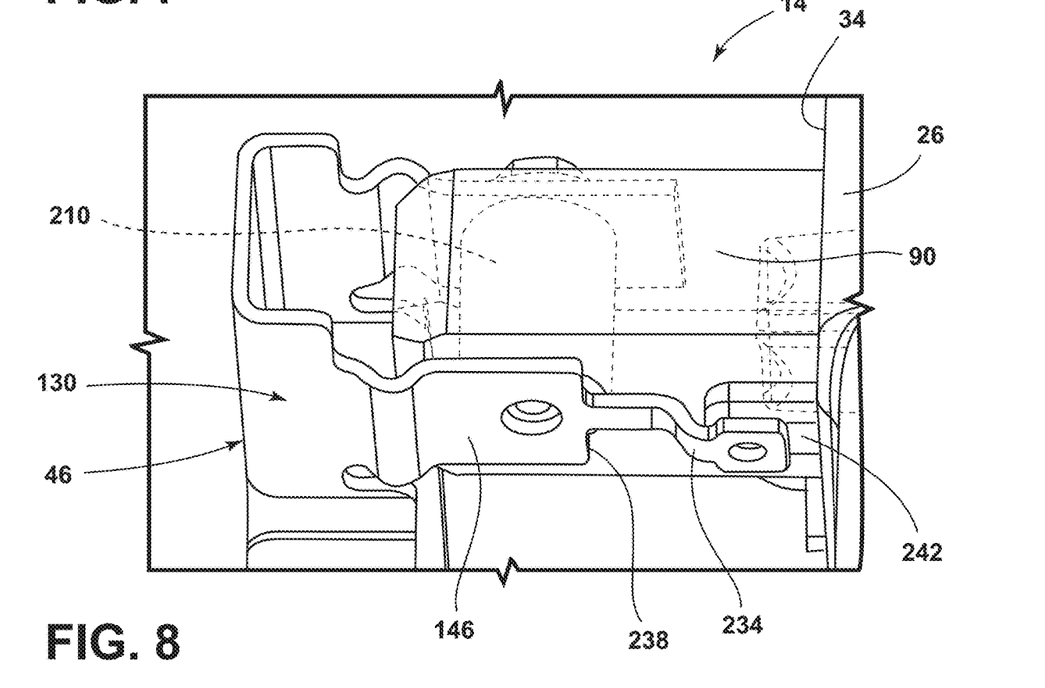
FIG. 8 is a partial bottom perspective view of conductive connection of the attachment feature, according to one example.

Referring to FIG. 8, the attachment feature 46 is illustrated having an electrically conductive connection 234 extending from a vehicle-forward edge 238 of the lower tab portion 146 of the second tab 130. The conductive connection 234 may be, for example, an integral ground strap. The conductive connection 234 can operate to redirect electrostatic discharges away from display screen 22 (FIG. 1). In various examples, the casing 26 includes a projection 242 extending from the back surface 34 of the casing 26 below the second protrusion 90 or be spaced apart from the second protrusion 90. The projection 242 may abut the bottom surface 174 of the second protrusion 90. The conductive connection 234 may also include a grounding screw electrically coupled to ground. In the depicted example, the second bushing 210 can prevent a grounding path from the display screen 22 (FIG. 1) to the bracket 50 (FIG. 2) and/or the vehicle 10 (FIG. 1). In other words, the second bushing 210 may insulate the display screen 22 (FIG. 1) from being ground. The conductive connection 234 can provide case grounding for the display screen (FIG. 1), which may overcome the insulation of the second bushing 210. The conductive connection 234 may cooperate with the projection 242 of the casing 26 to provide the grounding for the mounting assembly 14. It is also contemplated that the first tab 126 additionally or alternatively includes the conductive connection 234. It is further contemplated the projection 242 can be positioned proximate the first protrusion 86.

In operation, the mounting assembly 14 may provide an adjustable energy management system for the display screen 22. The display screen 22 may be mounted in either landscape or portrait orientation to the attachment feature 46, which may then be coupled to the bracket 50. The stiffness and energy absorbing properties of the mounting assembly 14 can be adjusted and tailored to a mass and a center of gravity for individual display screens 22. The bushing 38 and the attachment feature 46 may individually and in combination absorb energy in any direction.

Use of the present disclosure can provide a variety of advantages. First, vehicle displays often require vehicle-specific brackets to attach the display to the vehicle. The present mounting assembly 14 may be universally applied to different free-standing display screens 22 and/or vehicles 10. The mounting assembly 14 may be adjusted and/or tailored to individual display screens 22 and/or vehicles 10 via the bushing 38 and the attachment feature 46. The attachment feature 46 may then be coupled to the bracket 50, which may be vehicle-specific. Second, vehicle displays are typically subject to a variety of forces. The bracket 50 that couples the vehicle display to the instrument panel 18 often must be replaced when the vehicle display is subject to these forces due to damage and/or deformation of the bracket 50. Further, the brackets 50 are often designed to absorb only head impact and abuse loading (i.e., absorb energy in one direction). The present mounting assembly 14 can absorb and/or dampen the load acting on the display screen 22 through a two-step energy management system (e.g., the bushing 38 and the attachment feature 46). The bushing 38 and the attachment feature 46 cooperate to absorb energy in any direction that a load case may be applied. In other words, the mounting assembly 14 may be omni-directional.

According to various examples, a vehicle display mounting system may include an instrument panel and a display screen coupled to a casing. The casing may include a protrusion extending from a back surface of the casing towards the instrument panel. A bushing may be positioned within a receiving channel defined by a protrusion. An attachment feature may be coupled to the protrusion of the casing and coupled to the instrument panel via a bracket. Embodiments of the present disclosure may include one or a combination of the following features:

- a fastener retaining the attachment feature to the casing, wherein the fastener extends through an aperture defined by the attachment feature and extends through an inner cavity of the bushing;
- the attachment feature includes first and second tabs configured to cooperate with the protrusion of the casing;
- the first and second tabs each define standing flanges extending from lateral edges of the first and second tabs, respectively;
- the bushing includes an indexing feature configured to adjust the bushing within the receiving channel;
- the casing includes first and second protrusions defining first and second receiving channels;
- first and second bushings positioned within the first and second receiving channels;
- the first tab includes a first upper tab portion and a first lower tab portion and the second tab includes a second upper tab portion and a second lower tab portion;
- the first and second upper tab portions abut top surfaces of the first and second protrusions, respectively, and the first and second lower tab portions abut bottom surfaces of the first and second protrusions, respectively;
- the first upper and lower tabs extend from an opposing end portion of the attachment feature relative to the second upper and lower tabs;
- the first and second tabs each define an aperture configured to vertically align with the first and second receiving channels, respectively;
- fasteners extending through the apertures of the first and second tabs and further extending through inner cavities of the first and second bushings, respectively;
- the first and second tabs each define a rib configured to control displacement of at least one of the attachment feature, the display screen, and the casing;
- the attachment feature includes stiffening beads proximate the ribs on the first and second tabs, respectively, to guide a load acting on the attachment feature to the ribs;
- the attachment feature include a tab extending towards the casing at an angle in a range of from approximately 45° to approximately 90° relative to a body of the attachment feature;
- the attachment feature includes a body and multiple tabs extending from the body;
- each of the multiple tabs includes a rib, and wherein each rib is configured to deform at different rates in response to a force acting on the attachment feature;
- the bushing is tunable via internal plates; and
- the bushing is vertically oriented within a receiving channel of the protrusion such that the bushing is configured to interact with omni-directional and rotational forces.

Modifications of the disclosure will occur to those skilled in the art and to those who make or use the disclosure.

Therefore, it is understood that the embodiments shown in the drawings and described above are merely for illustrative purposes and not intended to limit the scope of the disclosure, which is defined by the following claims, as interpreted according to the principles of patent law, including the doctrine of equivalents.

It is to be understood that variations and modifications can be made on the aforementioned structure without departing from the concepts of the present disclosure, and further it is to be understood that such concepts are intended to be covered by the following claims unless these claims by their language expressly state otherwise.

What is claimed is:

1. A vehicle display screen mounting assembly, comprising:
   an instrument panel;
   a display screen coupled to a casing, wherein the casing includes a protrusion extending from a back surface of the casing towards the instrument panel;
   a bushing positioned within a receiving channel defined by the protrusion; and
   an attachment feature coupled to the protrusion of the casing, wherein the attachment feature is coupled to the instrument panel via a bracket, and wherein the attachment feature includes first and second tabs configured to cooperate with the protrusion of the casing, wherein the first and second tabs each define a rib configured to control displacement of at least one of the attachment feature, the display screen, and the casing.

2. The vehicle display screen mounting assembly of claim 1, further including:
   a fastener retaining the attachment feature to the casing, wherein the fastener extends through an aperture defined by the attachment feature and extends through an inner cavity of the bushing.

3. The vehicle display screen mounting assembly of claim 1, wherein the first and second tabs each define standing flanges extending from lateral edges of the first and second tabs, respectively.

4. The vehicle display screen mounting assembly of claim 1, wherein the attachment feature includes a conductive connection between the casing and the bracket.

5. A display screen mounting assembly for a vehicle, comprising:
   a display screen coupled to a casing, wherein the casing includes first and second protrusions defining first and second receiving channels, respectively;
   first and second bushings positioned within the first and second receiving channels;
   an attachment feature coupled to the first and second protrusions, wherein the attachment feature includes first and second tabs, and wherein the first and second tabs each define a rib configured to control displacement of at least one of the attachment feature, the display screen, and the casing; and
   a bracket coupled to the attachment feature.

6. The display screen mounting assembly of claim 5, wherein the first tab includes a first upper tab portion and a first lower tab portion and the second tab includes a second upper tab portion and a second lower tab portion.

7. The display screen mounting assembly of claim 6, wherein the first and second upper tab portions abut top surfaces of the first and second protrusions, respectively, and the first and second lower tab portions abut bottom surfaces of the first and second protrusions, respectively.

8. The display screen mounting assembly of claim 6, wherein the first upper and lower tab portions extend from an opposing end portion of the attachment feature relative to the second upper and lower tab portions.

9. The display screen mounting assembly of claim 5, wherein the first and second tabs each define an aperture configured to vertically align with the first and second receiving channels, respectively.

10. The display screen mounting assembly of claim 9, further comprising:
fasteners extending through the apertures of the first and second tabs and further extending through inner cavities of the first and second bushings, respectively.

11. The display screen mounting assembly of claim 5, wherein the attachment feature includes stiffening beads proximate the ribs on the first and second tabs, respectively, to guide a load acting on the attachment feature to the ribs.

12. A display screen mounting assembly for a vehicle, comprising:
a display screen coupled to a casing;
a bushing positioned within a protrusion of the casing; and
an attachment feature coupled to the protrusion, wherein the attachment feature includes a body and multiple tabs extending from the body, wherein the attachment feature includes a conductive connection between the casing and a bracket coupled to the attachment feature, and wherein each of the multiple tabs includes a rib, each rib configured to deform at different rates in response to a force acting on the attachment feature.

13. The display screen mounting assembly of claim 12, wherein at least one of the tabs extends towards the casing at an angle in a range of from approximately 45° to approximately 90° relative to the body of the attachment feature.

14. The display screen mounting assembly of claim 12, wherein the bushing is vertically oriented within a receiving channel of the protrusion such that the bushing is configured to interact with omni-directional and rotational forces.

15. The vehicle display screen mounting assembly of claim 1, wherein each rib is configured to deform at a different rate in response to a force acting on the attachment feature.

* * * * *